United States Patent
Lee et al.

(10) Patent No.: US 12,354,889 B2
(45) Date of Patent: Jul. 8, 2025

(54) APPARATUS FOR PROCESSING A SUBSTRATE AND METHOD OF PROCESSING A SUBSTRATE

(71) Applicant: Semes Co., Ltd., Cheonan-si (KR)

(72) Inventors: Muhyeon Lee, Cheonan-si (KR); Inryu Jeon, Cheonan-si (KR); Yeonju Lee, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 114 days.

(21) Appl. No.: 17/813,425

(22) Filed: Jul. 19, 2022

(65) Prior Publication Data

US 2023/0043752 A1    Feb. 9, 2023

(30) Foreign Application Priority Data

Aug. 5, 2021   (KR) .......................... 10-2021-0102996

(51) Int. Cl.
    *H01L 21/67*    (2006.01)
(52) U.S. Cl.
    CPC .... *H01L 21/67057* (2013.01); *H01L 21/6708* (2013.01)
(58) Field of Classification Search
    CPC ...................... H01L 21/67057; H01L 21/6708
    See application file for complete search history.

(56) References Cited

U.S. PATENT DOCUMENTS

| | | | |
|---|---|---|---|
| 6,589,338 B1 | 7/2003 | Nakamori et al. | |
| 6,770,149 B2 * | 8/2004 | Satou ...................... | B05C 11/08 |
| | | | 134/36 |
| 2007/0221253 A1 * | 9/2007 | Nishikido ........... | H01L 21/6715 |
| | | | 134/95.1 |
| 2008/0093340 A1 * | 4/2008 | Nakamori ......... | H01L 21/02019 |
| | | | 216/57 |
| 2012/0248061 A1 | 10/2012 | Brown et al. | |

FOREIGN PATENT DOCUMENTS

| | | |
|---|---|---|
| JP | H 1064877 A | 3/1998 |
| JP | 2009-010033 | 1/2009 |
| JP | 2014-041923 A | 3/2014 |
| JP | 2020-004817 A | 1/2020 |
| KR | 10-1997-0071149 A | 11/1997 |
| KR | 10-1999-0031613 A | 5/1999 |
| KR | 10-2003-0080370 A | 10/2003 |
| KR | 10-2010-0070231 A | 6/2010 |
| KR | 10-2013-0075675 A | 7/2013 |
| KR | 10-2020-0077654 A | 7/2020 |
| TW | 464937 B | 11/2001 |
| TW | 511175 B | 11/2002 |

OTHER PUBLICATIONS

Japanese Office Action/Notice of Reasons for Refusal (with Machine English Translation) dated Jul. 25, 2023 for Japanese Application No. 2022-112822; 11 Pages.

* cited by examiner

*Primary Examiner* — Michael E Barr
*Assistant Examiner* — Kevin G Lee
(74) *Attorney, Agent, or Firm* — Daly, Crowley, Mofford & Durkee, LLP

(57) ABSTRACT

An apparatus for processing a substrate may include a drain box for receiving a solution drained in a predetermined process, a drain line for discharging the solution from the drain box to an outside, and at least one spray member for providing a gas and/or a liquid to block an air flowed into the drain box and/or to control a humidity in the drain box.

14 Claims, 1 Drawing Sheet

APPARATUS FOR PROCESSING A SUBSTRATE AND METHOD OF PROCESSING A SUBSTRATE

CROSS-REFERENCE TO RELATED APPLICATION

This application claims priority to Korean Patent Application No. 10-2021-0102996 filed on Aug. 5, 2021 in the Korean Intellectual Property Office (KIPO), the contents of which are herein incorporated by reference in its entirety.

BACKGROUND

1. Field

Example embodiments of the invention relate to an apparatus for processing a substrate and a method of processing a substrate. More particularly, example embodiments of the invention relate to an apparatus for processing a substrate capable of performing an etching process using an etching solution including a phosphoric acid solution containing silica, and a method of processing a substrate using such apparatus for processing a substrate.

2. Related Technology

In manufacturing processes for a semiconductor device or a display device, a process for etching a layer formed on a substrate may be generally involved to form a circuit pattern on the substrate. When a nitride layer is formed on the substrate, a phosphoric solution containing silica is usually used as an etching solution.

In case that the nitride layer is etched using the phosphoric solution containing silica, a precipitate caused by silica may be generated in an apparatus for processing a substrate. Particularly, the precipitate may be formed in a drain box of the apparatus for processing a substrate. The precipitate formed in the drain box may move into lines and valves of the apparatus for processing a substrate in which various solutions flow, and thus the lines and the valves may be blocked or damaged by the precipitate.

SUMMARY

One aspect of the invention provides an apparatus for processing a substrate which may efficiently suppress the formation of precipitate from processing solution in a drain box and a drain line.

Another aspect of the invention provides a method of processing a substrate which may efficiently suppress the formation of precipitate from processing solution in a drain box and a drain line.

Still another aspect of the invention provides an apparatus for processing a substrate which may efficiently suppress the formation of precipitate caused by a contact between silica and an air a drain box and a drain line.

According to one aspect of the invention, there is provided an apparatus for processing a substrate comprising a drain box for receiving a processing solution drained in a predetermined process, a drain line for discharging the processing solution from the drain box to an outside, and at least one spray member for providing a gas and/or a liquid to block an air flowed into the drain box and/or to control a humidity in the drain box.

In some example embodiments, the apparatus for processing a substrate may include a plurality of spray members arranged by a substantially constant distance at an upper portion of the drain box. The plurality of spray members uniformly may spray the gas and/or the liquid toward a lower portion of the drain box.

In example embodiments, the at least one spray member may include a three way valve for connecting a first path along which the gas is supplied with a second path along which the liquid is supplied, or for blocking any one of the first path and the second path.

In example embodiments, the at least one spray member may provide the gas into the drain box when the predetermined process is stopped or the solution is entirely discharged from the drain box and the drain line. In addition, the at least one spray member may provide both of the gas and the liquid into the drain box when the predetermined is restarted.

In example embodiments, the apparatus for processing may additionally include a first adjusting member for adjusting an amount of the gas provided from the at least one spray member into the drain box when an internal pressure of the drain box is deviated from a range of a previously set pressure while the gas is supplied from the at least one spray member into the drain box.

The first adjusting member may cease a supply of the gas from the at least one spray member into the drain box when the internal pressure of the drain box is substantially greater than a maximum value of the previously set pressure.

The first adjusting member may control the amount of the gas provided from the at least one spray member into the drain box such that the internal pressure of the drain box is substantially greater than a pressure of the air when the air is flowed into the drain box through the drain line.

In example embodiments, the apparatus for processing a substrate may additionally include a second adjusting member for adjusting an amount of the liquid provided from the at least one spray member into the drain box when an internal humidity of the drain box is deviated from a range of a previously set humidity while the liquid is supplied from the at least one spray member into the drain box.

In example embodiments, the gas may include an air, a nitrogen gas or a mixture thereof. In addition, the liquid may include a deionized water, a phosphoric acid solution, a hydrofluoric acid or a mixture thereof.

According to another aspect of the invention, there is provided a method of processing a substrate comprising receiving a processing solution drained in a predetermined process into a drain box, discharging the processing solution from the drain box to an outside through a drain line, and providing a gas and/or a liquid from at least one spray member into the drain box to block an air flowed into the drain box and/or to adjust a humidity in the drain box.

In some example embodiments, the gas and/or the liquid may be uniformly sprayed from a plurality of spray members arranged by a substantially constant distance at an upper portion of the drain box toward a lower portion of the drain box.

In example embodiments, the gas may be provided from the at least one spray member into the drain box when the predetermined process is stopped or the solution is entirely discharged from the drain box and the drain line. In addition, both of the gas and the liquid may be provided from the at least one spray member into the drain box when the predetermined is restarted.

In example embodiments, the method of processing a substrate may additionally include measuring an internal pressure of the drain box, adjusting an amount of the gas provided from the at least one spray member into the drain box when the internal pressure of the drain box is deviated from a range of a previously set pressure while the gas is supplied from the at least one spray member into the drain box; ceasing a supply of the gas from the at least one spray member into the drain box when the internal pressure of the drain box is substantially greater than a maximum value of the previously set pressure, and adjusting the amount of the gas provided from the at least one spray member into the drain box such that the internal pressure of the drain box is substantially greater than a pressure of the air when the air is flowed into the drain box through the drain line.

In example embodiments, the method of processing a substrate may additionally include measuring an internal humidity of the drain box, and adjusting an amount of the liquid provided from the at least one spray member into the drain box when the internal humidity of the drain box is deviated from a range of a previously set humidity while the liquid is supplied from the at least one spray member into the drain box.

In example embodiments, the gas may include an air, a nitrogen gas or a mixture thereof. The liquid may include a deionized water, a phosphoric acid solution, a hydrofluoric acid or a mixture thereof.

According to still another aspect of the invention, there is provided an apparatus for processing a substrate comprising a drain box for receiving an etching solution drained in an etching process performed using the etching solution including a phosphoric acid solution containing silica, a drain line for discharging the etching solution from the drain box to an outside, and at least one spray member for blocking a contact between the silica in the phosphoric acid solution and an air and/or for adjusting a humidity in the drain box. The at least one spray member may provide a gas including an air, a nitrogen gas or a mixture thereof and/or a liquid including a deionized water, a phosphoric acid solution, a hydrofluoric acid or a mixture thereof into the drain box to suppress a formation of a precipitate caused by the silica.

In some example embodiments, the apparatus for processing a substrate may include a plurality of spray members arranged by a constant distance at an upper portion of the drain box. The plurality of spray members may uniformly spray the gas and/or the liquid toward a lower portion of the drain box.

In example embodiments, the at least one spray member may provide the gas into the drain box when the predetermined process is stopped or the solution is entirely discharged from the drain box and the drain line. In addition, the at least one spray member may provide both of the gas and the liquid into the drain box when the predetermined is restarted.

In example embodiments, the apparatus for processing a substrate may additionally include a first adjusting member for adjusting an amount of the gas provided from the at least one spray member into the drain box when an internal pressure of the drain box is deviated from a range of a previously set pressure while the gas is supplied from the at least one spray member into the drain box. The first adjusting member may cease a supply of the gas from the at least one spray member into the drain box when the internal pressure of the drain box is greater than a maximum value of the previously set pressure. The first adjusting member may control the amount of the gas provided from the at least one spray member into the drain box such that the internal pressure of the drain box is greater than a pressure of the air when the air is flowed into the drain box through the drain line.

In example embodiments, the apparatus for processing a substrate may additionally include a second adjusting member for adjusting an amount of the liquid provided from the at least one spray member into the drain box when an internal humidity of the drain box is deviated from a range of a previously set humidity while the liquid is supplied from the at least one spray member into the drain box.

According to example embodiments of the invention, the apparatus for processing a substrate including the at least one spray member may block the inflow of the air from the outside by the supply of the gas so that the apparatus for processing a substrate may suppress the formation of the precipitate caused by the reaction between the processing solution and oxygen contained in the air. Additionally, the apparatus for processing a substrate including the at least one spray member may constantly maintain the humidity by the supply of the liquid such that the apparatus for processing a substrate may suppress the formation of the precipitate caused by the relatively low humidity. Therefore, the apparatus for processing a substrate may prevent the lines and/or the valves through which the processing solution flows from being blocked or damaged by the precipitate.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
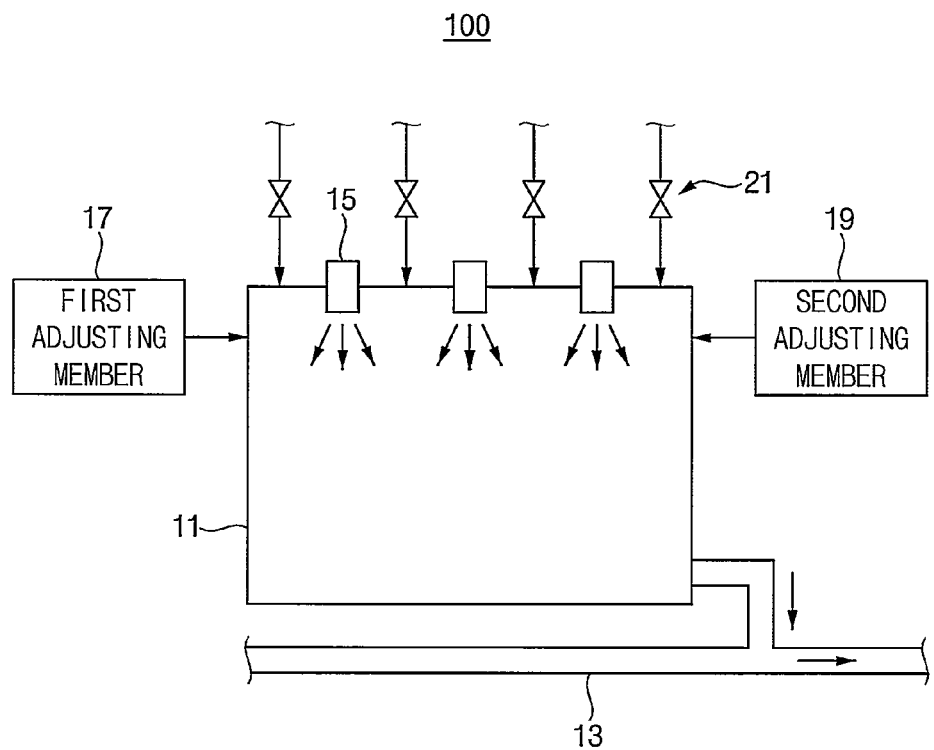
FIG. 1 is a schematic cross-sectional view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

Figure 2:
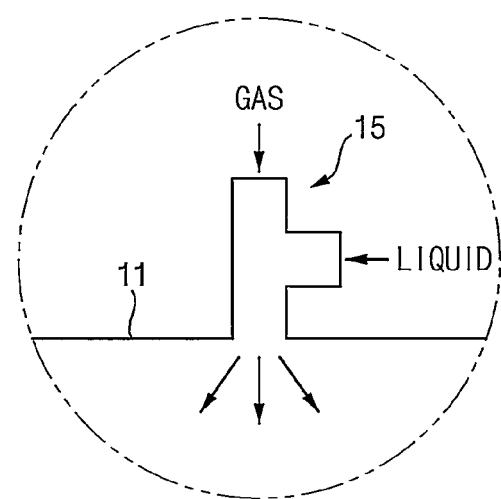
FIG. 2 is a schematic cross-sectional view illustrating a spraying member of an apparatus for processing s substrate in accordance with example embodiments of the invention.

FIG. 1 is a schematic cross-sectional view illustrating an apparatus for processing a substrate in accordance with example embodiments of the invention. FIG. 2 is a schematic cross-sectional view illustrating a spraying member of an apparatus for processing s substrate in accordance with example embodiments of the invention.

Referring to FIG. 1, an apparatus for processing a substrate 100 according to example embodiments may be used in processes of manufacturing an integrated circuit device such as a semiconductor device, a display device, etc. For example, the apparatus for processing a substrate 100 may execute a predetermined process such as a cleaning process or an etching process for processing a substrate using a processing solution such as a cleaning solution or an etching solution.

In example embodiments, the apparatus for processing a substrate 100 may perform an etching process for etching a nitride layer formed on a substrate using an etching solution including a phosphoric acid solution which may contain silica. Alternatively, the apparatus for processing a substrate 100 may execute a cleaning process for cleaning the substrate using a cleaning solution including deionized water.

The apparatus for processing a substrate 100 may generally include a predetermined process chamber in which the process such as the etching process or the cleaning process may be performed, a supply member including a supply line and a supply valve for providing a processing solution such as the etching solution or the cleaning solution into the process chamber, a vacuum member for controlling process conditions in the process chamber, etc. In this case, the processing solution may be drained from the process chamber and/or the supply member while performing the predetermined process using the apparatus for processing a substrate 100.

To treat the processing solution drained from the process chamber and/or the supply member, the apparatus for processing a substrate 100 may include a drain box 11, a drain line 13, at least one spray member 15, a first adjusting member 17, a second adjusting member 19, etc.

In example embodiments, the drain box 11 may receive the processing solution drained in the predetermined process performed in the process chamber. To this end, the drain box 11 may include a space for receiving the processing solution withdrawn from the process chamber and/or the supply member. Additionally, the drain box 11 may include a connection member 21 having a connection line and a valve in fluid communication with the process chamber and the supply member. In some example embodiments, the connection member 21 may include a plurality of connection lines and a plurality of valves provided in the connection lines, respectively.

The processing solution drained from the process chamber and/or the supply member may be discharged to an outside through the drain line 13. In example embodiments, the drain line 13 may have a flow line structure in which the drained processing solution may easily flow to the outside.

According to example embodiments, while performing the predetermined process (e.g., the etching process or the cleaning process) on the substrate using the apparatus for processing a substrate 100, the processing solution (e.g., the etching solution or the cleaning solution) may be drained from the process chamber and/or the supply member into the drain box 11. Then, the drained processing solution may be discharged from the drain box 11 to the outside through the drain line 13. Here, considering the ease flow of the drained processing solution, the connection member (s) 21 may be connected to the upper portion of the drain box 11 and the drain line 13 may be coupled to the lower portion of the drain box 11.

If the processing solution contacts an air, a precipitate may be formed in the processing solution. Particularly, the processing solution may make contact with the air in the drain line 13 when the drain line 13 is exposed to the outside, and thus the precipitate may be formed in the drain line 13. Here, the precipitate may move into the drain box 11 such that the connection member(s) 21 may be blocked or damaged by the precipitate. In example embodiments, while performing the etching process using the etching solution including the phosphoric acid solution containing the silica, the precipitate may be seriously formed in the drain line 13 and the drain box 11 since the silica may be easily reacted with the air. In addition, a moisture may be vaporized in the drain box 11 such that the drain box 11 may have a relatively low internal humidity and consequentially the precipitate may be generated in the drain box 11. Considering the above-mentioned problems, the apparatus for processing a substrate 100 may block the contact between the processing solution and the air as well as may maintain the internal humidity of the drain box 11 within a range of a previously set humidity.

Referring to FIG. 1 and FIG. 2, the at least one spray member 15 may provide a gas into the drain box 11 for blocking an air flowed into the drain box 11. Further, the at least one spray member 15 may provide a liquid into the drain box 11 for maintaining the internal humidity of the drain box 11 within the range of the previously set humidity.

In some example embodiments, the at least one spray member 15 may provide independently the gas and the liquid into the drain box 11. Further, the at least one spray member 15 may provide both of the gas and the liquid into the drain box 11. Here, the liquid in a form of mist may be sprayed from the at least one spray member 15 into the drain box 11.

The at least one spray member 15 may include a three way valve which may connect a first path along which the gas is supplied with a second path along which the liquid is supplied, or may block any one of the first path and the second path. In other words, the three way valve may connect the first path with the second path when the at least one spray member 15 provides both of the gas and the liquid into the drain box 11. Additionally, the three way valve may block the first path or the second path when the at least one spray member 15 supplies the gas or the liquid into the drain box 11.

In example embodiments, the at least one spray member 15 may be disposed at the upper portion of the drain box 11. The at least one spray member 15 may spray the gas and/or the liquid toward the lower portion of the drain box where the drain line 13 is positioned. In some example embodiments, the apparatus for processing a substrate 100 may include a plurality of spray members 15 arranged at the upper portion of the drain box 11 by a substantially constant distance. The plurality of spray members 15 may uniformly spray the gas and/or the liquid toward the lower portion of the drain box 11.

According to example embodiments, at least one spray member 15 may selectively provide the gas and/or the liquid into the drain box 11 while draining the processing solution from the process chamber and/or the supply member. Additionally, the at least one spray member 15 may provide the gas into the drain box 11 when the predetermined process is not performed or the processing solution is entirely withdrawn from the drain box 11 and the drain line 13. Furthermore, the at least one spray member 15 may provide both of the gas and the liquid into the drain box 11 when the predetermined process is stopped and then restarted by the apparatus for processing a substrate 100.

In example embodiments, the at least one spray member 15 may spray the gas including a nitrogen gas, an air or a mixture thereof into the drain box 11 so that the at least one spray member 15 may control the internal pressure of the drain box 11. Therefore, the formation of the precipitate caused by the silica contained in the phosphoric acid solution may be suppressed by blocking the air flowed from the outside into the drain box 11 through the drain line 13. In other words, the at least one spray member 15 may spray the gas into the drain box 11 toward the drain line 13 such that the at least one spray member 15 may prevent the air from flowing into the drain box 11 through the drain line 13. Accordingly, the formation of the precipitate may be suppressed in the drain box 11 by blocking the contact between the processing solution and the air. In addition, when the apparatus for processing a substrate 100 is stopped for the maintenance during a relatively long time, and then is operated again, the at least one spray member 15 may spray the liquid including a deionized water, a phosphoric acid solution, a hydrofluoric acid solution or a mixture thereof, or both of the gas and the liquid into the drain box 11 to thereby removing the remaining precipitate caused by the silica in the drain box 11.

In example embodiments, the at least one spray member 15 may selectively spray the liquid or the gas into the drain box 11 such that the at least one spray member 15 may maintain the internal humidity of the drain box 11 within the range of the previously set humidity. Accordingly, the formation of the precipitate in the drain box 11 may be more effectively suppressed by the at least one spray member 15.

As described above, the apparatus for processing a substrate 100 including the at least one spray member 15 may block the inflow of the air from the outside by the supply of the gas so that the apparatus for processing a substrate 100 may suppress the formation of the precipitate caused by the reaction between the processing solution and oxygen contained in the air. Additionally, the apparatus for processing a substrate 100 including the at least one spray member 15 may constantly maintain the humidity by the supply of the liquid such that the apparatus for processing a substrate 100 may suppress the formation of the precipitate caused by the relatively low humidity. In other words, the apparatus for processing a substrate 100 may effectively control the conditions in which the precipitate is generated. Therefore, the apparatus for processing a substrate may prevent lines and/or valves thereof through which the processing solution flows from being blocked or damaged by the precipitate.

In example embodiments, the liquid including the phosphoric acid solution, the hydrofluoric acid or the mixture thereof may dissolve the precipitate caused by the silica. Therefore, the apparatus for processing a substrate 100 may be advantageously employed in the etching process performed using the etching solution including the phosphoric acid solution containing the silica.

If the internal pressure of the drain box 11 is relatively low while the at least one spray member 15 provides the gas into the drain box 11, the air flowed into the drain box 11 through the drain line 13 may be sufficiently blocked. In contrast, the drain box 11 and the drain line 13 may be damaged if the internal pressure of the drain box 11 is relatively high. Therefore, the apparatus for processing a substrate 100 may include the first adjusting member 17 to control the internal pressure of the drain box 11.

Referring now to FIG. 1, the first adjusting member 17 may measure and control the internal pressure of the drain box 11 provided by the at least one spray member 15. When the internal pressure of the drain box 11 is deviated from a range of previously set pressure while the at least one spray member 15 sprays the gas into the drain box 11, the first adjusting member 17 may adjust an amount of the gas supplied from the at least one spray member 15. In example embodiments, the first adjusting member 17 may include a sensing member for measuring the internal pressure of the drain box 11 and a controlling member for adjusting the amount of the gas sprayed from the at least one spray member 15.

When the internal pressure of the drain box 11 is substantially greater than a maximum value of the previously set pressure, the first adjusting member 17 may cease the supply of the gas from the at least one spray member 15 since the drain line 13 may be in a state in which the drain line 13 is blocked. In this case, the drain line 13 and the drain box 11 may be checked after stopping the supply of the gas from the at least one spray member 15. The first adjusting member 17 may control the amount of the gas supplied from the at least one spray member 15 such that the internal pressure of the drain box 11 is substantially greater than a pressure of the air flowed into the drain box 11 through the drain line 13.

In some example embodiments, the first adjusting member 17 may adjust the amount of the gas supplied from the at least one spray member 15 as well as the first adjusting member 17 may control both of the amounts of the gas and the liquid such that the internal pressure of the drain box 11 is within the range of the previously set pressure when the gas and the liquid are simultaneously provided from the at least one spray member 15 into the drain box 11.

In example embodiments, the formation of the precipitate in the drain box 11 and the drain line 13 may not be sufficiently suppressed when the internal humidity of the drain box 11 is relatively low while the at least one spray member 15 provides the liquid onto the drain box 11. If the internal humidity of the drain box 11 is relatively high, the liquid may be excessively consumed to thereby increasing manufacturing costs. Therefore, the apparatus for processing a substrate 100 may include the second adjusting member 19 for measuring and controlling the internal humidity of the drain box 11.

As illustrated in FIG. 1, the second adjusting member 19 may adjust the amount of the liquid sprayed from the at least one spray member 15 when the internal humidity of the drain box 11 is deviated from the range of the previously set humidity while the at least one spray member 15 provides the liquid into the drain box 11.

In example embodiments, the second adjusting member 19 may include a sensing member for measuring the internal humidity of the drain box 11 (that is, a concentration of the processing solution) and a controlling member for adjusting the amount of the liquid supplied from the at least one spray member 15.

In some example embodiments, the second adjusting member 19 may control the amount of the liquid provided from the at least one spray member 15 as well as the second adjusting member 19 may control both of the amounts of the liquid and the gas so that the internal humidity of the drain box 11 is within the range of the previously set humidity when the liquid and the gas are simultaneously supplied from the at least one spray member 15 into the drain box 11.

In a method of processing a substrate according to example embodiments, the processing solution may be drained from the process chamber and/or the supply member in the predetermined process performed using the apparatus for processing a substrate 100. The processing solution drained in the predetermined process may be received in the drain box 11, and then may be discharged from the drain box 11 through the drain line 13. The gas and/or the liquid may be provided from at least one spray member 15 into the drain box 11 to block the air flowed into the drain box 11 and/or to adjust the humidity in the drain box 11. Therefore, the formation of the precipitate caused by the processing solution in the drain box 11 and the drain line 13 may be suppressed.

In some example embodiments, the gas and/or the liquid may be uniformly sprayed from the plurality of spray members 15 arranged by the substantially constant distance at the upper portion of the drain box 11 toward a lower portion of the drain box 11.

In example embodiments, the gas may be provided from the at least one spray member 15 into the drain box 11 when the predetermined process is stopped or the processing solution is entirely discharged from the drain box 11 and the drain line 13. In addition, both of the gas and the liquid may be provided from the at least one spray member 15 into the drain box 11 when the predetermined is restarted.

In example embodiments, the internal pressure of the drain box 11 may be measure, and then the amount of the gas provided from the at least one spray member 15 into the drain box 11 may be adjusted when the internal pressure of the drain box 11 is deviated from the range of the previously set pressure while the gas is supplied from the at least one spray member 15 into the drain box 11. Here, the supply of the gas from the at least one spray member 15 into the drain box 11 may be stopped when the internal pressure of the drain box 11 is substantially greater than the maximum value of the previously set pressure. In addition, the amount of the gas provided from the at least one spray member 15 into the drain box 11 may be adjusted such that the internal pressure of the drain box 11 is substantially greater than the pressure of the air when the air is flowed into the drain box 11 through the drain line 13. In some example embodiments, the amount of the gas and the amount of the liquid provided from the at least one spray member 15 into the drain box 11 may be controlled to adjust the internal pressure of the drain box 11.

In example embodiments, the internal humidity of the drain box 11 may be measured, and then the amount of the liquid provided from the at least one spray member 15 into the drain box 11 may be adjusted when the internal humidity of the drain box 11 is deviated from the range of the previously set humidity while the liquid is supplied from the at least one spray member 15 into the drain box 11. In some example embodiments, the amount of the liquid and the amount of the gas provided from the at least one spray member 15 into the drain box 11 may be controlled to adjust the internal humidity of the drain box 11.

According to example embodiments, the formation of the precipitate derived from the processing solution may be effectively suppressed in the drain box 11 and the drain line 13, and also the inflow of the precipitate through the drain line 13 and the drain box 11 may be efficiently prevented.

The apparatus for processing a substrate and the method of processing a substrate according to example embodiments may be advantageously employed in manufacturing various devices such as a volatile memory device, a non-volatile memory device, a system semiconductor device, an image sensor, an organic light emitting display device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An apparatus for processing a substrate, which comprises:
    a drain box for receiving a processing solution drained in a predetermined process;
    a drain line for discharging the processing solution from the drain box to an outside; and
    at least one spray member disposed in an upper portion of the drain box for providing a gas and a liquid to block an air flowed into the drain box and to control a humidity and a pressure in the drain box, wherein the at least one spray member comprises a three way valve for connecting a first path along which the gas is supplied with a second path along which the liquid is supplied, or for blocking in part any one of the first path and the second path, and wherein the at least one spray member uniformly sprays the gas and the liquid toward a lower portion of the drain box.

2. The apparatus for processing a substrate of claim 1, wherein the apparatus for processing a substrate comprises a plurality of spray members arranged by a constant distance at the upper portion of the drain box.

3. The apparatus for processing a substrate of claim 1, wherein the at least one spray member provides the gas into the drain box when the predetermined process is stopped or the solution is entirely discharged from the drain box and the drain line, and
    wherein the at least one spray member provides both of the gas and the liquid into the drain box when the predetermined is restarted.

4. The apparatus for processing a substrate of claim 1, further comprising a first adjusting member for adjusting an amount of the gas provided from the at least one spray member into the drain box when an internal pressure of the drain box is deviated from a range of a previously set pressure while the gas is supplied from the at least one spray member into the drain box, and
    wherein the first adjusting member decreases a supply of the gas from the at least one spray member into the drain box when the internal pressure of the drain box is greater than a maximum value of the previously set pressure.

5. The apparatus for processing a substrate of claim 4, wherein the first adjusting member controls the amount of the gas provided from the at least one spray member into the drain box such that the internal pressure of the drain box is greater than a pressure of the air when the air is flowed into the drain box through the drain line.

6. The apparatus for processing a substrate of claim 1, further comprising a second adjusting member for adjusting an amount of the liquid provided from the at least one spray member into the drain box when an internal humidity of the drain box is deviated from a range of a previously set humidity while the liquid is supplied from the at least one spray member into the drain box.

7. The apparatus for processing a substrate of claim 1, wherein the gas includes an air, a nitrogen gas or a mixture thereof, and the liquid includes a deionized water, a phosphoric acid solution, a hydrofluoric acid or a mixture thereof.

8. The apparatus for processing a substrate of claim 1, further comprising two adjusting members, wherein a first adjusting member adjusts an amount of the gas provided from the at least one spray member and a second adjusting member adjusts an amount of the liquid provided from the at least one spray member.

9. An apparatus for processing a substrate, which comprises:
    a drain box for receiving an etching solution drained in an etching process performed using the etching solution including a phosphoric acid solution containing silica;
    a drain line for discharging the etching solution from the drain box to an outside; and
    at least one spray member disposed in an upper portion of the drain box for blocking a contact between the silica in the phosphoric acid solution and an air and for adjusting a humidity and a pressure in the drain box, the at least one spray member providing a gas including an air, a nitrogen gas or a mixture thereof and a liquid including a deionized water, a phosphoric acid solution, a hydrofluoric acid or a mixture thereof into the drain box to suppress a formation of a precipitate caused by the silica, wherein the at least one spray member comprises a three way valve for connecting a first path along which the gas is supplied with a second path along which the liquid is supplied, or for blocking in part any one of the first path and the second path, wherein the at least one spray member uniformly sprays the gas and the liquid toward a lower portion of the drain box.

10. The apparatus for processing a substrate of claim 9, wherein the apparatus for processing a substrate comprises a plurality of spray members arranged by a constant distance at the upper portion of the drain box.

11. The apparatus for processing a substrate of claim 9, wherein the at least one spray member provides the gas into the drain box when the predetermined process is stopped or the solution is entirely discharged from the drain box and the drain line, and
    wherein the at least one spray member provides both of the gas and the liquid into the drain box when the predetermined is restarted.

12. The apparatus for processing a substrate of claim 9, further comprising a first adjusting member for adjusting an amount of the gas provided from the at least one spray member into the drain box when an internal pressure of the drain box is deviated from a range of a previously set pressure while the gas is supplied from the at least one spray member into the drain box,
    wherein the first adjusting member decreases a supply of the gas from the at least one spray member into the drain box when the internal pressure of the drain box is greater than a maximum value of the previously set pressure, and
    wherein the first adjusting member controls the amount of the gas provided from the at least one spray member into the drain box such that the internal pressure of the drain box is greater than a pressure of the air when the air is flowed into the drain box through the drain line.

13. The apparatus for processing a substrate of claim 9, further comprising a second adjusting member for adjusting an amount of the liquid provided from the at least one spray member into the drain box when an internal humidity of the drain box is deviated from a range of a previously set humidity while the liquid is supplied from the at least one spray member into the drain box.

14. The apparatus for processing a substrate of claim 9, further comprising two adjusting members, wherein a first adjusting member adjusts an amount of the gas provided from the at least one spray member and a second adjusting member adjusts an amount of the liquid provided from the at least one spray member.

* * * * *